(12) United States Patent
Yoshida

(10) Patent No.: US 11,695,523 B2
(45) Date of Patent: Jul. 4, 2023

(54) DISTRIBUTION SHAPING METHOD, DISTRIBUTION DESHAPING METHOD, DISTRIBUTION SHAPING ENCODER, DISTRIBUTION SHAPING DECODER, AND TRANSMISSION SYSTEM

(71) Applicant: MITSUBISHI ELECTRIC CORPORATION, Tokyo (JP)

(72) Inventor: Tsuyoshi Yoshida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 194 days.

(21) Appl. No.: 17/369,266

(22) Filed: Jul. 7, 2021

(65) Prior Publication Data
US 2021/0336733 A1  Oct. 28, 2021

Related U.S. Application Data

(63) Continuation of application No. PCT/JP2019/007279, filed on Feb. 26, 2019.

(51) Int. Cl.
*H04L 5/00* (2006.01)

(52) U.S. Cl.
CPC .................. *H04L 5/0046* (2013.01)

(58) Field of Classification Search
CPC . H04L 5/0046; H04L 25/03866; H04L 25/49; H03M 5/20
See application file for complete search history.

(56) References Cited

U.S. PATENT DOCUMENTS

| 9,673,907 B1 | 6/2017 | Vassilieva et al. |
| 2014/0185375 A1* | 7/2014 | Kim .................... G11C 16/3431 365/185.02 |
| 2016/0020929 A1* | 1/2016 | Yamazaki ............... H04L 27/18 375/300 |
| 2017/0279561 A1* | 9/2017 | Nakamura .......... H04L 27/0008 |
| 2021/0135778 A1 | 5/2021 | Yoshida |

FOREIGN PATENT DOCUMENTS

| EP | 3 588 883 A1 | 1/2020 |
| JP | 2008-154202 A | 7/2008 |
| JP | 2008-242034 A | 10/2008 |
| JP | 2012-70410 A | 4/2012 |
| JP | 2015-149873 A | 8/2015 |

(Continued)

OTHER PUBLICATIONS

Bocherer et al. "Probabilistic Shaping and Forward Error Correction for Fiber-Optic Communication Systems", Journal of Lightwave Technology, IEEE, vol. 37, No. 2, Jan. 15, 2019 pp. 230-244.

(Continued)

*Primary Examiner* — Minh Trang T Nguyen
(74) *Attorney, Agent, or Firm* — Birch, Stewart, Kolasch & Birch, LLP

(57) ABSTRACT

In a distribution shaping method, information compression and distribution shaping are executed at the same time. A symbol sequence of a predetermined length is allocated to an input bit sequence of a predetermined length on a one-to-one basis. In the allocation, a bit sequence smaller in entropy is allocated a symbol sequence smaller in average power.

18 Claims, 9 Drawing Sheets

(56) References Cited

FOREIGN PATENT DOCUMENTS

| JP | 2017-184234 A | 10/2017 |
| WO | WO 2018/167920 A1 | 9/2018 |
| WO | WO 2020/031257 A1 | 2/2020 |

OTHER PUBLICATIONS

Extended European Search Repport dated Jan. 12, 2022 issued in counterpart European Application No. 19917387.3.
"Interfaces for the optical transport network", ITU-T G.709/Y.1331, Jun. 2016, 244 pages.
Böcherer et al., "Bandwidth Efficient and Rate-Matched Low-Density Parity-Check Coded Modulation", IEEE Transactions on Communications, vol. 63, No. 12, Dec. 2015, pp. 4651-4665.
Schutte et al., "Constant Composition Distribution Matching", IEEE Transactions on Information Theory, vol. 62, No. 1, Jan. 2016, pp. 430-434.
Yoshida et al., "Hierarchical Distribution Matching for Probabilistically Shaped Coded Modulation", arXiv:1809.01653v1, Sep. 5, 2018, pp. 1-9.

\* cited by examiner

DISTRIBUTION SHAPING METHOD, DISTRIBUTION DESHAPING METHOD, DISTRIBUTION SHAPING ENCODER, DISTRIBUTION SHAPING DECODER, AND TRANSMISSION SYSTEM

CROSS REFERENCE TO RELATED APPLICATIONS

This application is a Continuation of PCI International Application PCT/JP2019/007279, filed on Feb. 26, 2019, which is hereby expressly incorporated by reference into the present application.

TECHNICAL FIELD

The present invention relates to a distribution shaping method, a distribution deshaping method, an encoder configured to execute distribution shaping, a decoder configured to execute distribution deshaping, and a transmission system including: a transmission device that includes the encoder; a reception device that includes the decoder; and a transmission path.

BACKGROUND ART

A method of causing asymptotic approach of communication capacity to Shannon capacity by shaping a probability distribution of an information source in a transmission system is being investigated. This method is called "probabilistic shaping."

In the probabilistic shaping method, processing called "distribution matching" is executed on a transmission side and processing called "distribution dematching" is executed on a reception side.

In Non Patent Literature 1, there is described a method involving executing, when the probabilistic shaping method is combined with error correction, distribution matching upstream of error correction coding on the transmission side, and executing distribution dematching downstream of error correction decoding on the reception side.

The terms "distribution matching" and "distribution dematching" are used in the probabilistic shaping method in terms of matching a probability distribution of an information source with some goal distribution. However, when there is no clear goal distribution, it is sufficient in the probabilistic shaping method when an ultimately obtained probability distribution is suitable for communication.

In this case, terms "distribution shaping" and "distribution deshaping" are considered to be more appropriate.

Herein, the terms "distribution shaping" and "distribution deshaping" are therefore used from now on.

CITATION LIST

Non Patent Literature

[NPL 1] G. Bocherer et al, "Bandwidth Efficient and Rate-Matched Low-Density Parity-Check Coded Modulation," IEEE Transactions on Communications, vol. 63, no. 12, pp. 4651-4665, December 2015.

SUMMARY OF INVENTION

Technical Problem

In optical fiber transmission, on-off keying is mainly used. Appearance probabilities of "0" and "1" are therefore normally evened out by bit scrambling in order to avoid performance deterioration due to uneven numbers of "0"s and "1"s in an optical signal, a failure to reproduce a clock, and the like.

However, an information source in a real traffic is normally unbalanced in appearance frequencies of "0" and "1". For instance, "0" is dominant when a MAC frame is in an idle state. When an alarm indication signal is transferred, "1" is dominant.

It is therefore appropriate to regard an information source in a real traffic to be an uneven information source that changes with time in statistical properties. The forced evening out of appearance frequencies of "0" and "1" by bit scrambling in such an information source is an unrequired increase in entropy from the viewpoint of information theory.

The present invention has been made in order to solve the problem described above, and an object thereof is to provide a distribution shaping method and a distribution deshaping method that are applicable to an uneven information source changing with time and are yet capable of suppressing an unrequired increase in entropy.

Another object of the present invention is to provide an encoder configured to execute the distribution shaping described above, and a decoder configured to execute the distribution deshaping described above.

Still another object of the present invention is to provide a transmission system including: a transmission device that includes the encoder described above; a reception device that includes the decoder described above; and a transmission path.

Solution to Problem

In order to solve the above-mentioned problem, according to one embodiment of the present invention, there is provided a distribution shaping method including a step of allocating a symbol sequence of a predetermined length to a bit sequence of a predetermined length, by allocating a symbol sequence smaller in average power out of available symbol sequences when the bit sequence includes a larger number of bits that have a first value.

Further, according to one embodiment of the present invention, there is provided a distribution deshaping method including a step of allocating a bit sequence of a predetermined length to a symbol sequence of a predetermined length, by allocating a bit sequence larger in the number of bits that have a first value out of available bit sequences when the symbol sequence is smaller in average power.

Further, according to one embodiment of the present invention, there is provided a distribution shaping encoder including: a pre-stage circuit configured to divide, following a predetermined rule, a bit sequence of a predetermined length into a first bit sequence and a second bit sequence, and output the first bit sequence and the second bit sequence; an allocation circuit configured to allocate, to the first bit sequence, a symbol sequence smaller in average power out of available symbol sequences when the first bit sequence includes a larger number of bits that have a first value; a delay adjustment circuit configured to adjust a delay of the second bit sequence and a delay of the symbol sequence so that the delays are the same, and output the second bit sequence and the symbol sequence; and a post-stage circuit configured to generate a new symbol sequence by combining, following a predetermined rule, the second bit sequence and the symbol sequence that are output from the delay adjustment circuit, and output the new symbol sequence.

Further, according to one embodiment of the present invention, there is provided a distribution shaping decoder including: a pre-stage circuit configured to divide, following a predetermined rule, a symbol sequence of a predetermined length into a first symbol sequence and a second symbol sequence, and output the first symbol sequence and the second symbol sequence; an allocation circuit configured to allocate, to the first symbol sequence, a bit sequence larger in the number of bits that have a first value out of available bit sequences when the first symbol sequence is smaller in average power; a delay adjustment circuit configured to adjust a delay of the second symbol sequence and a delay of the bit sequence so that the delays are the same, and output the second symbol sequence and the bit sequence; and a post-stage circuit configured to generate a new bit sequence by combining, following a predetermined rule, the second symbol sequence and the bit sequence that are output from the delay adjustment circuit, and output the new bit sequence.

Further, according to one embodiment of the present invention, there is provided a transmission system including: a transmission device including the distribution shaping encoder described above; a reception device including the distribution shaping decoder described above; and a transmission path.

Advantageous Effects of Invention

According to the present invention, it is possible to apply the present invention to an uneven information source changing with time and yet to suppress an unrequired increase in entropy.

DESCRIPTION OF EMBODIMENTS

Now, details of embodiments of the invention disclosed in the present application are described with reference to the accompanying drawings. It should be noted, however, that the embodiments described below are merely examples, and the present invention is not limited to those embodiments.

First Embodiment

Figure 1:
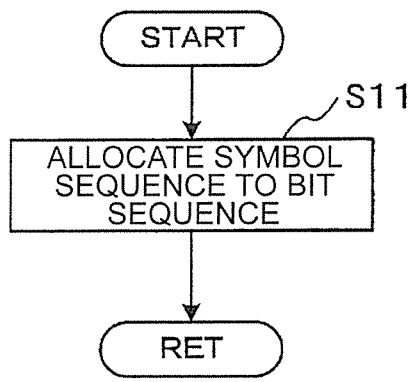
FIG. 1 is a flow chart of a distribution shaping method according to a first embodiment of the present invention.

FIG. 1 is a flow chart of a distribution shaping method according to a first embodiment of the present invention. In the first embodiment and second and third embodiments described later, information compression and distribution shaping are executed at the same time.

In Step S11, a symbol sequence of a predetermined length is allocated to an input bit sequence of a predetermined length on a one-to-one basis. In this step, a bit sequence smaller in entropy is allocated a symbol sequence smaller in average power. More specifically, a bit sequence including a larger number of bits that have a "first value" is allocated a symbol sequence smaller in average power out of available symbol sequences. The "first value" is one of "0" and "1". In the first embodiment and embodiments described later, a case in which the first value is "0" and a second value is "1" is described. The present invention, however, similarly works when the two are switched so that the first value and the second value are "1" and "0", respectively.

In the first embodiment and the second and third embodiments described later, a symbol can have, for example, an absolute value of an octal pulse amplitude modulation (PAM) symbol, namely, 1, 3, 5, or 7.

In this case, one-to-one conversion from a bit sequence to a symbol sequence is expressed by a conversion table in which input is a 3-bit sequence and output is a 2-symbol sequence as in, for example, Table 1 given below.

TABLE 1

1) Bit sequence: 000 → Symbol sequence: 11: Average power 1
2) Bit sequence: 001 → Symbol sequence: 13: Average power 5
3) Bit sequence: 010 → Symbol sequence: 31: Average power 5
4) Bit sequence: 100 → Symbol sequence: 33: Average power 9
5) Bit sequence: 011 → Symbol sequence: 15: Average power 13
6) Bit sequence: 101 → Symbol sequence: 51: Average power 13
7) Bit sequence: 110 → Symbol sequence: 35: Average power 17
8) Bit sequence: 111 → Symbol sequence: 53: Average power 17

The use of the conversion table of Table 1 enables more suppression of the average power and entropy of an output symbol sequence for an input bit sequence including a larger number of bits that have the "first value," namely, "0", with a minimum distance between symbols maintained at 2.

A case in which the input bit sequence includes a large number of bits that are "0" corresponds to, for example, a case in which a large number of MAC frames are in an idle state.

In an additive white Gaussian noise environment, for example, a signal-to-noise (SNR) ratio required to obtain predetermined performance can accordingly be reduced. Alternatively, overall power consumption of the transmission system at the same performance can be reduced by repeating error correction decoding a smaller number of times or employing simpler error correction.

The conversion table of Table 1 is a simple table for the sake of description. In the first embodiment and the second and third embodiments described later, a bit sequence may have a length of, for example, from several ten bits to several thousand bits. A symbol sequence may have a length of, for example, from several ten symbols to several thousand symbols.

The conversion table of Table 1 includes a plurality of bit sequences equal to one another in the number of bits that have the "first value," namely, "0" in some cases. There is also a case in which the conversion table of Table 1 includes a plurality of symbol sequences equal to one another in average power. The order in the conversion table of Table 1 is therefore not determined uniquely.

In the conversion table of Table 1, bit sequences equal to each other in the number of bits that have the "first value," namely, "0", can switch places with each other. Similarly, symbol sequences equal to each other in average power can switch places with each other.

A switch of places between bit sequences different from each other in the number of bits that have the "first value," namely, "0", for the purpose of, for example, scaling down the conversion table, does not affect resultant performance much and may accordingly be adoptable as long as the switch is not to an excessive degree.

Similarly, a switch of places between symbol sequences different from each other in average power does not affect resultant performance much and may accordingly be adoptable as long as the switch is not to an excessive degree.

Second Embodiment

Figure 2:
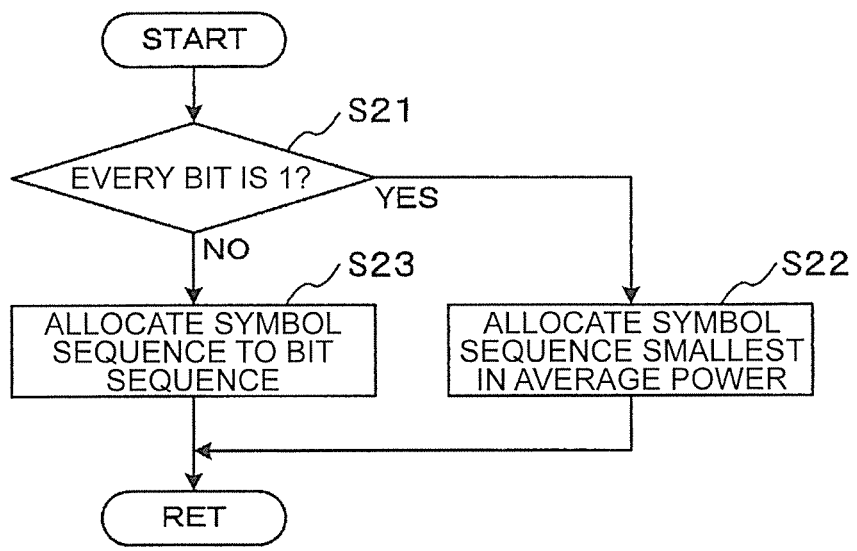
FIG. 2 is a flow chart of a distribution shaping method according to a second embodiment of the present invention.

FIG. 2 is a flow chart of a distribution shaping method according to the second embodiment of the present invention.

In Step S21, whether every bit in an input bit sequence of a predetermined length has the second value, namely, "1", is determined.

When the answer is "YES" in Step S21 and every bit accordingly has the second value, namely, "1", the processing flow proceeds to Step S22. When the answer is "NO" in Step S21 and not every bit accordingly has the second value, namely, "1", meaning that bits that are "0" are included, the processing flow proceeds to Step S23.

In Step S22, a symbol sequence selected in advance is allocated to the bit sequence. The symbol sequence selected in advance is a symbol sequence that has the smallest average power among available symbol sequences.

In Step S23, a symbol sequence smaller in average power is allocated to a bit sequence smaller in entropy. More specifically, a bit sequence including a larger number of bits that have the first value, namely, "0", is allocated a symbol sequence smaller in average power from available symbol sequences excluding the symbol sequence that is selected in advance.

In the first embodiment described above, the average power of the output symbol sequence is undesirably large when every bit in the input bit sequence has the second value, namely, "1". In contrast, in the second embodiment, the average power of the output symbol sequence is minimum in a target section when every bit in the input bit sequence has the second value, namely, "1".

The case in which every bit in the input bit sequence is "1" corresponds to, for example, a case in which an alarm indication signal is transferred.

In the second embodiment, the output symbol sequence can be kept small in average power and entropy when the input bit sequence includes a large number of bits that have the first value, namely, "0", and when every bit in the input bit sequence has the second value, namely, "1".

In the second embodiment, Step S23 is executed for many bit sequences. In the processing of Step S23, a symbol sequence that has the smallest average power among available symbol sequences is lost unlike in the first embodiment. However, this does not affect the resultant performance much, and the second embodiment is expected to be adoptable in many cases.

In Step S22 described above, the symbol sequence selected in advance may be a symbol sequence that has intermediate average power, as the next best to the symbol sequence that has the smallest average power.

For example, the symbol sequence selected in advance may be a symbol sequence that has average power smaller than a median value of average power of symbol sequences available for allocation.

Third Embodiment

Figure 3:
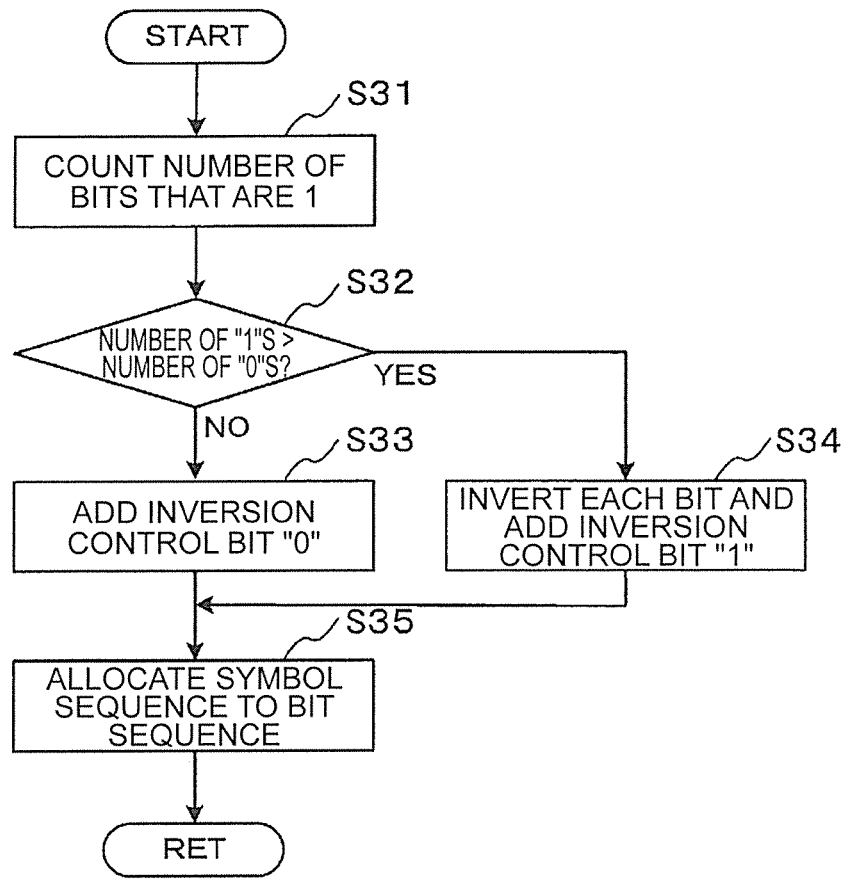
FIG. 3 is a flow chart of a distribution shaping method according to a third embodiment of the present invention.

FIG. 3 is a flow chart of a distribution shaping method according to the third embodiment of the present invention.

In Step S31, the number of bits that have the second value, namely, "1", is counted for an input bit sequence of a predetermined length.

In Step S32, whether the number of bits that have the second value, namely, "1", is larger than the number of bits that have the first value, namely, "0", is determined for the bit sequence.

When the answer is "NO" in Step S32 and the number of bits that have the second value, namely, "1", is accordingly equal to or less than the number of bits that have the first value, namely, "0", the processing flow proceeds to Step S33. When the answer is "YES" in Step S32 and the number of bits that have the second value, namely, "1", is larger than the number of bits that have the first value, namely, "0", on the other hand, the processing flow proceeds to Step S34.

In Step S33, the first value, namely, "0", is added as an inversion control bit to the bit sequence.

In Step S34, each bit is inverted, and then the second value, namely, "1", is added as an inversion control bit to the bit sequence.

In Step S35, a symbol sequence smaller in average power is allocated to a bit sequence smaller in entropy. More specifically, a bit sequence including a larger number of bits that have the first value, namely, "0", is allocated a symbol sequence smaller in average power from available symbol sequences.

The case in which the number of bits that are "1" is larger than the number of bits that are "0" in the input bit sequence corresponds to, for example, a case in which an alarm indication signal is transferred, a case in which a part of an alarm indication signal is included, and a case in which the proportion of bits that are "1" is large when user traffic is transferred without a gap.

The inversion control bit indicating whether a bit sequence has been inverted may be placed among a group of bits that form a symbol sequence, or may be placed in a frame header excluded from the group of bits, a sign bit corresponding to the polarity of PAM, or other places.

The second embodiment described above can deal with only the case in which every bit in the input bit sequence has the second value, namely, "1", and cannot stop the average power and entropy of the output symbol sequence from increasing when the input bit sequence includes a small number of bits that have the first value, namely, "0".

In contrast, in the third embodiment, the average power and entropy of the output symbol sequence can be kept small in a target section in both of the case in which the number of bits that have the second value, namely, "1", is large in the input bit sequence and the case in which the number of bits that have the first value, namely, "0", is large in the input bit sequence.

In the third embodiment, the average power and entropy of the output symbol sequence can accordingly be kept small in cases in which the number of bits that have the first value, namely, "0", and the number of bits that have the second value, namely, "1", is unbalanced in the input bit sequence.

In the first to third embodiments described above, appearance frequencies of "0" and "1" are based on a frame format for current optical fiber communication. The appearance frequencies of "0" and "1", however, may be switched depending on definition. Obviously, the first to third embodiments only require switching of "0" and "1" to be applicable to that case.

Fourth Embodiment

Figure 4:
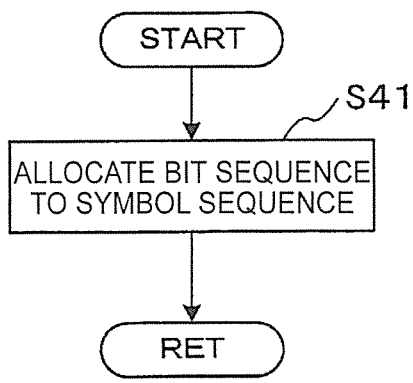
FIG. 4 is a flow chart of a distribution deshaping method according to a fourth embodiment of the present invention.

FIG. 4 is a flow chart of a distribution deshaping method according to a fourth embodiment of the present invention. In the fourth embodiment and fifth to seventh embodiments described later, distribution deshaping and information decompression are executed at the same time. The distribution deshaping method according to the fourth embodiment is used in combination with the distribution shaping method according to the first embodiment.

In Step S41, a bit sequence of a predetermined length is allocated to an input symbol sequence of a predetermined length. In this step, a symbol sequence smaller in average power is allocated a bit sequence larger in the number of bits that have the first value, namely, "0", from available bit sequences.

In the fourth embodiment and the fifth to seventh embodiments described later, conversion from a symbol sequence to a bit sequence is at least partially on a one-to-one basis.

In the case of an octal PAM symbol, for example, conversion of a part that is on a one-to-one basis is expressed by a conversion table in which input is a 2-symbol sequence and output is a 3-bit sequence as in, for example, Table 2 given below.

TABLE 2

1) Symbol sequence: 11: Average power 1 → Bit sequence: 000
2) Symbol sequence: 13: Average power 5 → Bit sequence: 001
3) Symbol sequence: 31: Average power 5 → Bit sequence: 010
4) Symbol sequence: 33: Average power 9 → Bit sequence: 100
5) Symbol sequence: 15: Average power 13 → Bit sequence: 011
6) Symbol sequence: 51: Average power 13 → Bit sequence: 101
7) Symbol sequence: 35: Average power 17 → Bit sequence: 110
8) Symbol sequence: 53: Average power 17 → Bit sequence: 111

The conversion table of Table 2 corresponds to reverse resolution of the conversion table of Table 1 in the first embodiment described above. That is, the conversion of Step S41 in the fourth embodiment is reverse conversion of the conversion of Step S11 in the first embodiment described above.

Further, for example, conversion of a part that is not on a one-to-one basis is expressed by a conversion table in which input is a 2-symbol sequence and output is a 3-bit sequence as in, for example, Table 3 given below.

TABLE 3

9) Symbol sequence: 55: Average power 25 → Bit sequence: 111
10) Symbol sequence: 17: Average power 25 → Bit sequence: 011
11) Symbol sequence: 71: Average power 25 → Bit sequence: 101
12) Symbol sequence: 37: Average power 29 → Bit sequence: 110
13) Symbol sequence: 73: Average power 29 → Bit sequence: 111
14) Symbol sequence: 57: Average power 37 → Bit sequence: 110
15) Symbol sequence: 75: Average power 37 → Bit sequence: 111
16) Symbol sequence: 77: Average power 49 → Bit sequence: 111

The conversion table of Table 3 does not include the contents of the conversion table of Table 2. It is therefore not required to use the conversion table of Table 3 when every transmission symbol defined in the first embodiment described above is received without an error, owing to, for example, error correction.

Realistically, however, an occasional error is a possibility and it is preferred to define a conversion table like Table 3. Alternatively, a uniform output bit sequence, for example, 111, may be set to those eight cases for the sake of simplification.

With the use of the conversion tables of Table 2 and Table 3, an input symbol sequence smaller in average power is converted to an output bit sequence larger in the number of bits that have the first value, namely, "0".

The conversion tables of Table 2 and Table 3 each include a plurality of symbol sequences equal to one another in average power in some cases. There is also a case in which the conversion tables of Table 2 and Table 3 each include a plurality of bit sequences equal to one another in the number of bits that have the first value, namely, "0". The order in the conversion tables of Table 2 and Table 3 is therefore not determined uniquely.

In a manner corresponding to the first embodiment described above, symbol sequences equal to each other in average power can switch places with each other in the conversion tables of Table 2 and Table 3. Similarly, symbol sequences equal to each other in the number of bits that have the first value, namely, "0", can switch places with each other.

A switch of places between symbol sequences different from each other in average power for the purpose of, for example, scaling down the conversion table, does not affect resultant performance much and may accordingly be adoptable as long as the switch is not to an excessive degree.

Similarly, a switch of places between bit sequences different from each other in the number of bits that have the "first value," namely, "0" does not affect resultant performance much and may accordingly be adoptable as long as the switch is not to an excessive degree.

Fifth Embodiment

Figure 5:
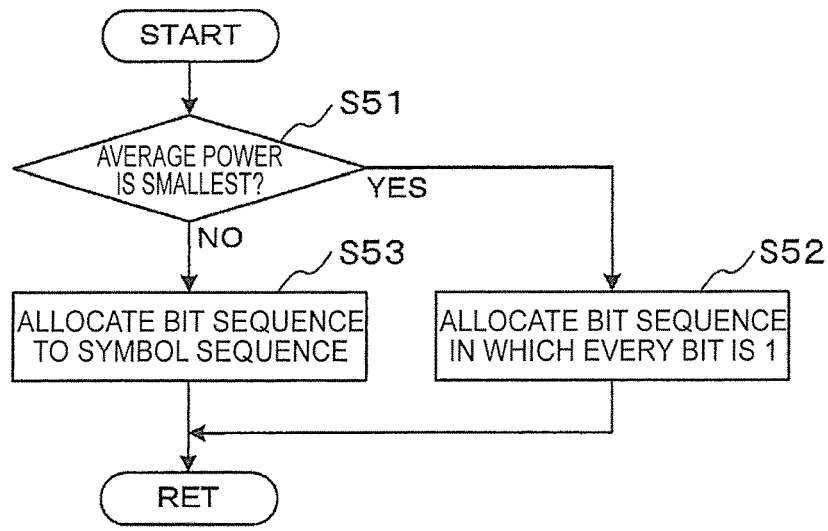
FIG. 5 is a flow chart of a distribution deshaping method according to a fifth embodiment of the present invention.

FIG. 5 is a flow chart of a distribution deshaping method according to the fifth embodiment of the present invention. The distribution deshaping method according to the fifth embodiment is used in combination with the distribution shaping method according to the second embodiment.

In Step S51, whether an input symbol sequence of a predetermined length is a symbol sequence selected in advance is determined. The symbol sequence selected in advance is a symbol sequence that has the smallest average power among available symbol sequences.

When the answer is "YES" in Step S51, that is, when the input symbol sequence is a symbol sequence that has the smallest average power, the processing flow proceeds to Step S52. When the answer is "NO" in Step S51, that is, when the input symbol sequence is not a symbol sequence that has the smallest average power, the processing flow proceeds to Step S53.

In Step S52, a bit sequence in which every bit has the second value, namely, "1", is allocated to the symbol sequence.

In Step S53, a symbol sequence smaller in average power is allocated a bit sequence larger in the number of bits that have the first value, namely, "0", from available bit sequences excluding the above-mentioned bit sequence in which every bit has the first value, namely, "0". Conversion tables used in the allocation are similar to the conversion tables of Table 2 and Table 3 in the fourth embodiment described above.

In a manner corresponding to the second embodiment described above, the symbol sequence selected in advance may be a symbol sequence that has intermediate average power in Step S51 described above, as the next best to the symbol sequence that has the smallest average power.

For example, the symbol sequence selected in advance may be a symbol sequence that has average power smaller than a median value of average power of available symbol sequences.

Sixth Embodiment

Figure 6:
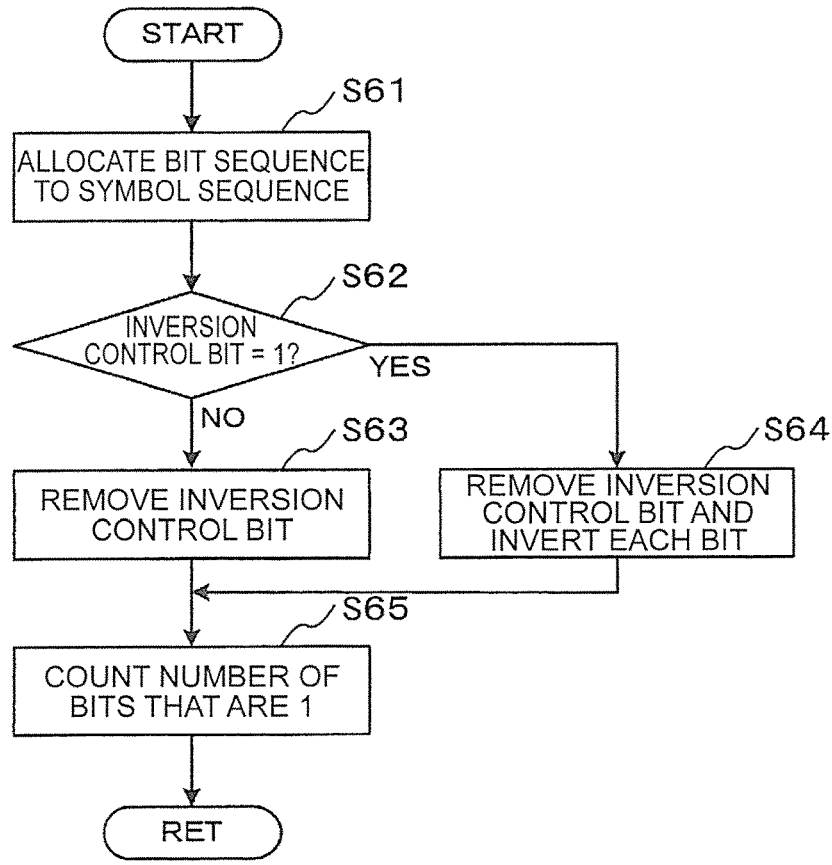
FIG. 6 is a flow chart of a distribution deshaping method according to a sixth embodiment of the present invention.

FIG. 6 is a flow chart of a distribution deshaping method according to the sixth embodiment of the present invention. The distribution deshaping method according to the sixth embodiment is used in combination with the distribution shaping method according to the third embodiment.

In Step S61, a bit sequence of a predetermined length is allocated to an input symbol sequence of a predetermined length. In this step, a symbol sequence smaller in average power is allocated a bit sequence larger in the number of bits that have the first value, namely, "0", from available bit sequences. Conversion tables used in the allocation are similar to the conversion tables of Table 2 and Table 3 in the fourth embodiment described above.

In Step S62, whether an inversion control bit of the bit sequence allocated in Step S61 has the second value, namely, "1", is determined.

When the answer is "NO" in Step S62 and the inversion control bit accordingly does not have the second value, namely, "1", the processing flow proceeds to Step S63. When the answer is "YES" in Step S62 and the inversion control bit accordingly has the second value, namely, "1", the processing flow proceeds to Step S64.

In Step S63, the inversion control bit of the bit sequence is removed.

In Step S64, the inversion control bit of the bit sequence is removed and then each bit is inverted.

In Step S65, the number of bits that have the second value, namely, "1", is counted for the bit sequence. Step S65, however, is for a function of monitoring bit sequences and a result of this counting is not used for further processing. Step S65 may therefore be omitted.

Seventh Embodiment

Figure 7:
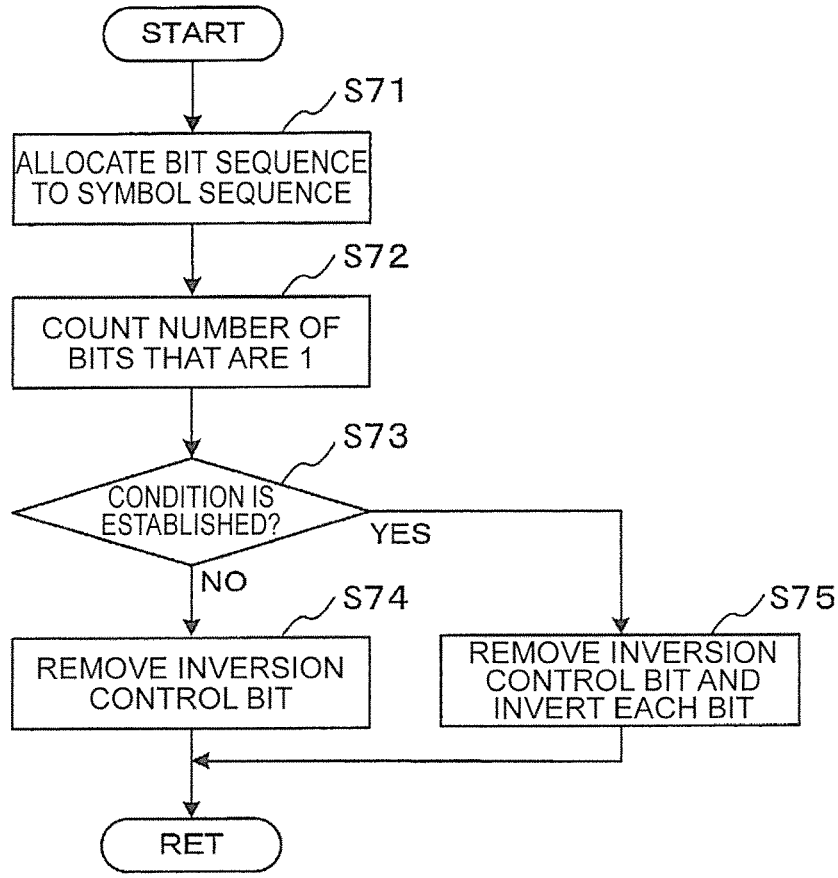
FIG. 7 is a flow chart of a distribution deshaping method according to a seventh embodiment of the present invention.

FIG. 7 is a flow chart of a distribution deshaping method according to the seventh embodiment of the present invention. The distribution deshaping method according to the seventh embodiment is used in combination with the distribution shaping method according to the third embodiment.

In Step S71, a bit sequence of a predetermined length is allocated to an input symbol sequence of a predetermined length. In this step, a symbol sequence smaller in average power is allocated a bit sequence larger in the number of bits that have the first value, namely, "0", from available bit sequences. Conversion tables used in the allocation are similar to the conversion tables of Table 2 and Table 3 in the fourth embodiment described above.

In Step S72, the number of bits that have the second value, namely, "1", is counted for the bit sequence allocated in Step S71.

In Step S73, whether a condition that an inversion control bit has the second value, namely, "1", and that the number of bits that have the second value, namely, "1", is equal to or less than a first set number, or a condition that an inversion control bit has the first value, namely, "0", and that the number of bits that have the second value, namely, "1", is equal to or more than a second set number, is established is determined for the bit sequence. The first set number may be 60, for example. The second set number may be 61, for example.

When the answer is "NO" in Step S73, that is, when the condition described above is not established, the processing flow proceeds to Step S74. When the answer is "YES" in Step S73, that is, when the condition described above is established, on the other hand, the processing flow proceeds to Step S75.

In Step S74, the inversion control bit of the bit sequence is removed.

In Step S75, the inversion control bit of the bit sequence is removed and then each bit is inverted.

In the sixth embodiment described above, an error in the inversion control bit possibly leads to a large-scale error. In contrast, in the seventh embodiment, a situation in which an error in the inversion control bit leads to a large-scale error can be avoided.

Eighth Embodiment

Figure 8:
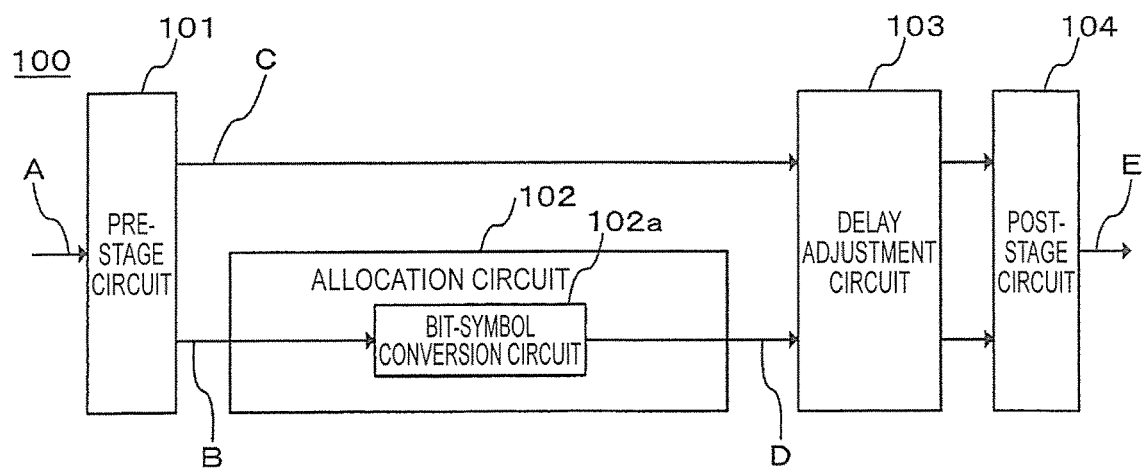
FIG. 8 is a diagram for illustrating a configuration of a distribution shaping encoder according to an eighth embodiment of the present invention.

FIG. 8 is a diagram for illustrating a configuration of a distribution shaping encoder 100 according to an eighth embodiment of the present invention.

The distribution shaping encoder 100 includes a pre-stage circuit 101, an allocation circuit 102, a delay adjustment circuit 103, and a post-stage circuit 104.

For example, a bit sequence A which is a frame for optical fiber communication is input to the distribution shaping encoder 100 from the outside.

The pre-stage circuit 101 is configured to divide the externally input bit sequence A which has a predetermined length into a first bit sequence B and a second bit sequence C, following a predetermined rule. The pre-stage circuit 101 outputs the first bit sequence B to the allocation circuit 102 and outputs the second bit sequence C to the delay adjustment circuit 103.

When the number of input bits is 200 bits, for example, the pre-stage circuit 101 outputs less significant 120 bits as the first bit sequence B to the allocation circuit 102, and outputs more significant 80 bits as the second bit sequence C to the delay adjustment circuit 103.

In dividing the input bits, some bits may be treated as invalid bits. The more significant bits and the less significant bits may switch places with each other. Instead of dividing the input bit sequence A into more significant bits and less significant bits, some bits may be extracted from the input bit sequence A to be the first bit sequence B, with remaining bits joined to form the second bit sequence C.

The allocation circuit 102 is configured to allocate, based on the method described above in the first or second embodiment, a symbol sequence to the first bit sequence B input from the pre-stage circuit 101, and output the symbol sequence to the delay adjustment circuit 103.

To describe in detail, the allocation circuit 102 includes a bit-symbol conversion circuit 102a. The bit-symbol conversion circuit 102a stores, for example, lookup tables described in T. Yoshida et al., "Hierarchical Distribution Matching for Probabilistically Shaped Coded Modulation," 2018, [Online], Available: www.arxiv.org/abs/1809.01653. The bit-symbol conversion circuit 102a is configured to convert, for example, a bit sequence having 121 bits into an octal PAM symbol sequence having 80 symbols. Absolute values of amplitude of an octal PAM symbol are 1, 3, 5, and 7 and, accordingly, an octal PAM symbol sequence having 80 symbols is actually a bit sequence having 160 bits.

The delay adjustment circuit 103 is configured to adjust a delay of a symbol sequence D input from the pre-stage circuit 101 via the allocation circuit 102 and a delay of the second bit sequence C input directly from the pre-stage circuit 101 so that the two sequences have the same delay, and then output the two sequences.

The post-stage circuit 104 is configured to generate a new symbol sequence E by combining, following a predetermined rule, the second bit sequence C and the symbol sequence D which are output from the delay adjustment circuit 103, and output the symbol sequence E.

For example, the post-stage circuit 104 generates an octal PAM symbol sequence having 80 symbols. When error correction coding is to be executed further downstream, a sign bit is required to have a reserved area for a parity bit for the error correction coding. In that case, the number of valid bits of the second bit sequence C input to the delay adjustment circuit 103 directly from the pre-stage circuit 101 is set to be smaller than the number of valid bits of the symbol sequence D output from the allocation circuit 102 by the number of parity bits to be inserted.

In the distribution shaping encoder 100 according to the eighth embodiment, when the bit sequence A input to the pre-stage circuit 101 includes a large number of bits that have the first value, namely, "0", the average power and entropy of the symbol sequence E output from the post-stage circuit 104 can be kept small by executing processing that is based on the method described in the first embodiment in the allocation circuit 102.

In the distribution shaping encoder 100 according to the eighth embodiment, when the bit sequence A input to the pre-stage circuit 101 includes a large number of bits that have the first value, namely, "0", and when every bit in the bit sequence A has the second value, namely, "1", the average power and entropy of the symbol sequence E output from the post-stage circuit 104 can be kept small by executing processing that is based on the method described in the second embodiment in the allocation circuit 102.

Ninth Embodiment

Figure 9:
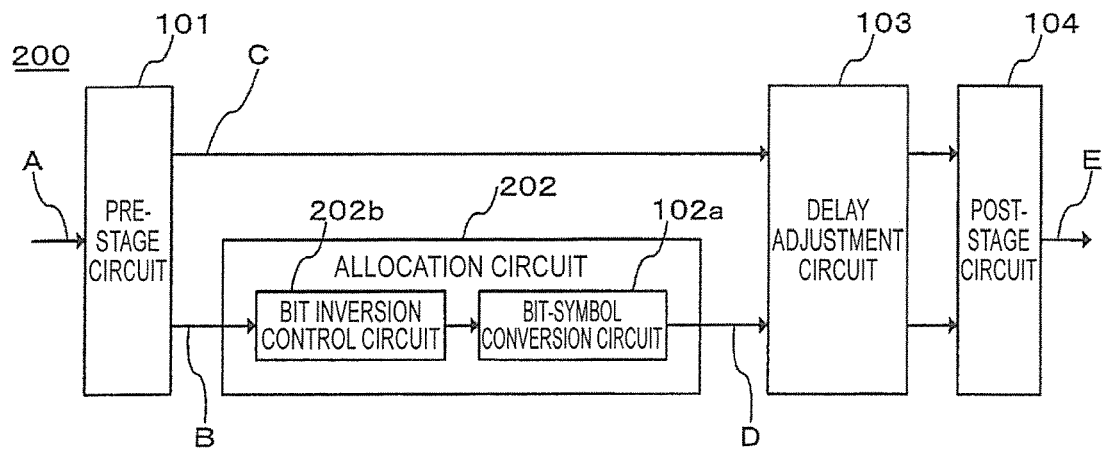
FIG. 9 is a diagram for illustrating a configuration of a distribution shaping encoder according to a ninth embodiment of the present invention.

FIG. 9 is a diagram for illustrating a configuration of a distribution shaping encoder 200 according to a ninth embodiment of the present invention. In the following description, a component that is the same as or similar to one of the components in the eighth embodiment is denoted by the same reference symbol, and a detailed description thereof is omitted.

The distribution shaping encoder 200 includes the pre-stage circuit 101, an allocation circuit 202, the delay adjustment circuit 103, and the post-stage circuit 104.

The allocation circuit 202 is configured to allocate, based on the method described above in the third embodiment, a symbol sequence to the first bit sequence B input from the pre-stage circuit 101, and output the symbol sequence to the delay adjustment circuit 103.

To describe in detail, the allocation circuit 202 includes the bit-symbol conversion circuit 102a and a bit inversion control circuit 202b.

The bit inversion control circuit 202b is configured to count the number of bits that have the second value, namely, in the first bit sequence B. This is equivalent to calculating the sum of all bits. When the number of bits that have the second value, namely, "1", is larger than the number of bits that have the first value, namely, "0", in the first bit sequence B, the bit inversion control circuit 202b next adds the first value, namely, "0", as an inversion control bit to the first bit sequence B. When the number of bits that have the second value, namely, "1", is equal to or smaller than the number of bits that have the first value, namely, "0", in the first bit sequence B, on the other hand, the bit inversion control circuit 202b inverts each bit in the first bit sequence B and then adds the second value, namely, "1", as an inversion control bit. Lastly, the bit inversion control circuit 202b outputs the first bit sequence B with the inversion control bit added thereto to the bit-symbol conversion circuit 102a.

With the distribution shaping encoder 200 according to the ninth embodiment, an effect equivalent to the effect that results from allocating an inversion control bit to a non-sign bit in the method according to the third embodiment described above can be obtained.

Tenth Embodiment

Figure 10:
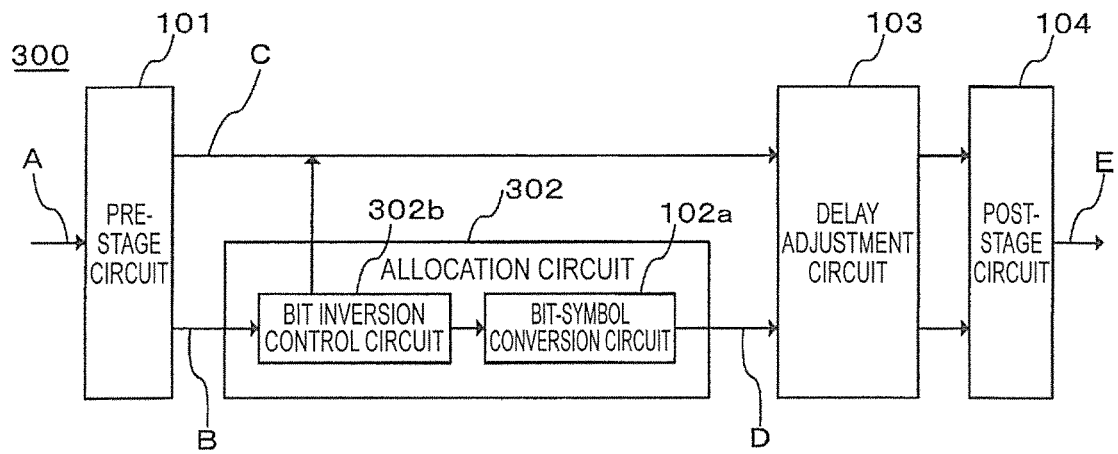
FIG. 10 is a diagram for illustrating a configuration of a distribution shaping encoder according to a tenth embodiment of the present invention.

FIG. 10 is a diagram for illustrating a configuration of a distribution shaping encoder 300 according to a tenth embodiment of the present invention.

The distribution shaping encoder 300 includes the pre-stage circuit 101, an allocation circuit 302, the delay adjustment circuit 103, and the post-stage circuit 104.

The allocation circuit 302 is configured to allocate, based on the method described above in the third embodiment, a symbol sequence to the first bit sequence B input from the pre-stage circuit 101, and output the symbol sequence to the delay adjustment circuit 103.

To describe in detail, the allocation circuit 302 includes the bit-symbol conversion circuit 102a and a bit inversion control circuit 302b.

When the number of bits that have the second value, namely, "1", is larger than the number of bits that have the first value, namely, "0", in the first bit sequence B, the bit inversion control circuit 302b adds "0" as an inversion control bit to the second bit sequence C. When the number of bits that have the second value, namely, "1", is equal to or smaller than the number of bits that have the first value, namely, "0", in the first bit sequence B, on the other hand, the bit inversion control circuit 302b inverts each bit in the first bit sequence B and then adds the second value, namely, "1", as an inversion control bit to the second bit sequence C.

With the distribution shaping encoder 200 according to the tenth embodiment, an effect equivalent to the effect that results from allocating an inversion control bit to a sign bit in the method according to the third embodiment described above can be obtained.

Eleventh Embodiment

Figure 11:
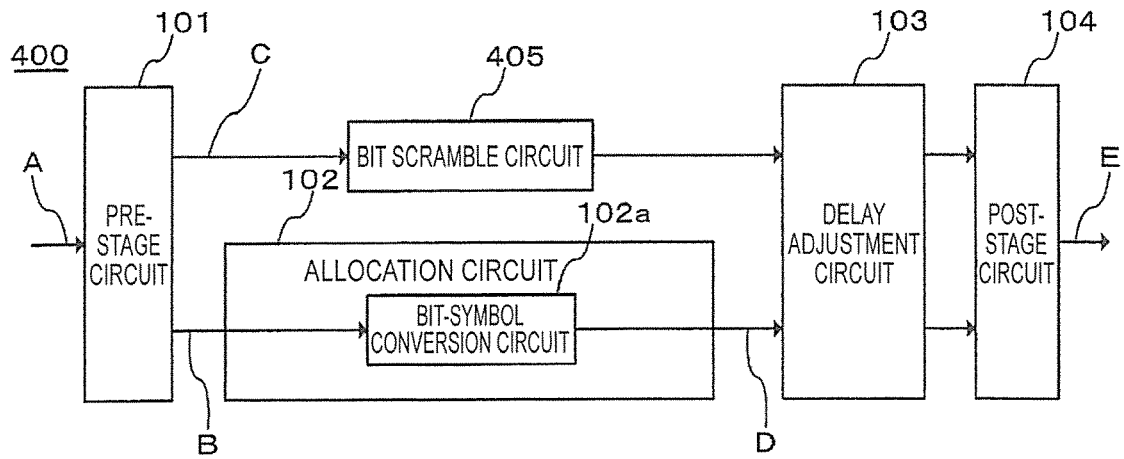
FIG. 11 is a diagram for illustrating a configuration of a distribution shaping encoder according to an eleventh embodiment of the present invention.

FIG. 11 is a diagram for illustrating a configuration of a distribution shaping encoder 400 according to an eleventh embodiment of the present invention.

The distribution shaping encoder 400 includes, in addition to the components of the distribution shaping encoder 100 according to the eighth embodiment described above, a bit scramble circuit 405.

The bit scramble circuit 405 is configured to execute bit scrambling by calculating exclusive OR of the second bit sequence C input from the pre-stage circuit 101 and a pseudo random sequence or the like, and output a result to the delay adjustment circuit 103.

Unbalanced proportions of the number of bits that have the first value, namely, "0", and the number of bits that have the second value, namely, "1", in the second bit sequence C input to the bit scramble circuit 405 can be evened out by executing the bit scrambling.

With the distribution shaping encoder 400 according to the eleventh embodiment, appearance frequencies of the positive polarity and the negative polarity can be evened out in the symbol sequence E output from the post-stage circuit 104. This eliminates unrequired deterioration in signal transmission in an electrical domain or an optical domain. This also enables clock reproduction on the reception side.

An effect similar to the effect of the eleventh embodiment can be obtained also in the ninth or tenth embodiment described above by adding the bit scramble circuit.

Twelfth Embodiment

Figure 12:
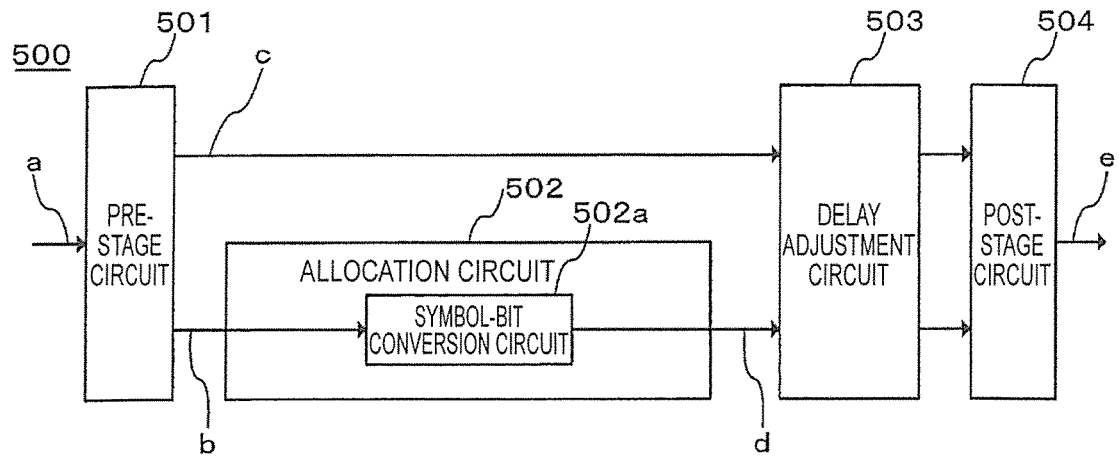
FIG. 12 is a diagram for illustrating a configuration of a distribution shaping decoder according to a twelfth embodiment of the present invention.

FIG. 12 is a diagram for illustrating a configuration of a distribution shaping decoder 500 according to a twelfth embodiment of the present invention. The distribution shaping decoder 500 according to the twelfth embodiment is used in combination with the distribution shaping encoder 100 according to the eighth embodiment described above.

The distribution shaping decoder 500 includes a pre-stage circuit 501, an allocation circuit 502, a delay adjustment circuit 503, and a post-stage circuit 504.

For example, a symbol sequence "a" which has undergone error correction decoding is input to the distribution shaping decoder 500 from the outside.

The pre-stage circuit 501 is configured to divide the externally input symbol sequence "a" which has a predetermined length into a first symbol sequence "b" and a second symbol sequence "c", following a predetermined rule. The pre-stage circuit 501 outputs the first symbol sequence "b" to the allocation circuit 502 and outputs the second symbol sequence "c" to the delay adjustment circuit 503.

When the number of input symbols is 80, for example, the pre-stage circuit 501 outputs a part that is an octal PAM symbol sequence as the first symbol sequence "b" to the allocation circuit 502, and outputs the remaining part which is a coded bit sequence as the second symbol sequence "c" to the delay adjustment circuit 503.

When the parity bit for error correction is not included due to removal upstream, the number of bits in the coded bit sequence is smaller than the number of symbols in the octal PAM sequence. When dummy data is transferred as a reserved area for the parity bit for error correction as well, one of possible options is to send the post-error-correction-decoding parity bit downstream as it is.

The allocation circuit 502 is configured to allocate, based on the method described above in the fourth or fifth embodiment, a bit sequence to the first symbol sequence "b" input from the pre-stage circuit 501, and output the symbol sequence to the delay adjustment circuit 503.

To describe in detail, the allocation circuit 502 includes a symbol-bit conversion circuit 502a. The symbol-bit conversion circuit 502a stores, for example, lookup tables described in T. Yoshida et al., "Hierarchical Distribution Matching for Probabilistically Shaped Coded Modulation," 2018, [Online], Available: www.arxiv.org/abs/1809.01653. The symbol-bit conversion circuit 502a is configured to convert, for example, an octal PAM symbol sequence having 80 symbols into a bit sequence having 120 bits.

The delay adjustment circuit 503 is configured to adjust a delay of a bit sequence "d" input from the pre-stage circuit 501 via the allocation circuit 502 and a delay of the second symbol sequence "c" input directly from the pre-stage circuit 501 so that the two sequences have the same delay, and then output the two sequences.

The post-stage circuit 504 is configured to generate a new bit sequence "e" by combining, following a predetermined rule, the second symbol sequence "c" and the bit sequence "d" which are output from the delay adjustment circuit 503, and output the bit sequence "e".

The distribution shaping decoder 500 according to the twelfth embodiment provides, when used in combination with the distribution shaping encoder 100 according to the eighth embodiment described above, effects that include a reduction in required SNR and reduced power consumption.

Thirteenth Embodiment

Figure 13:
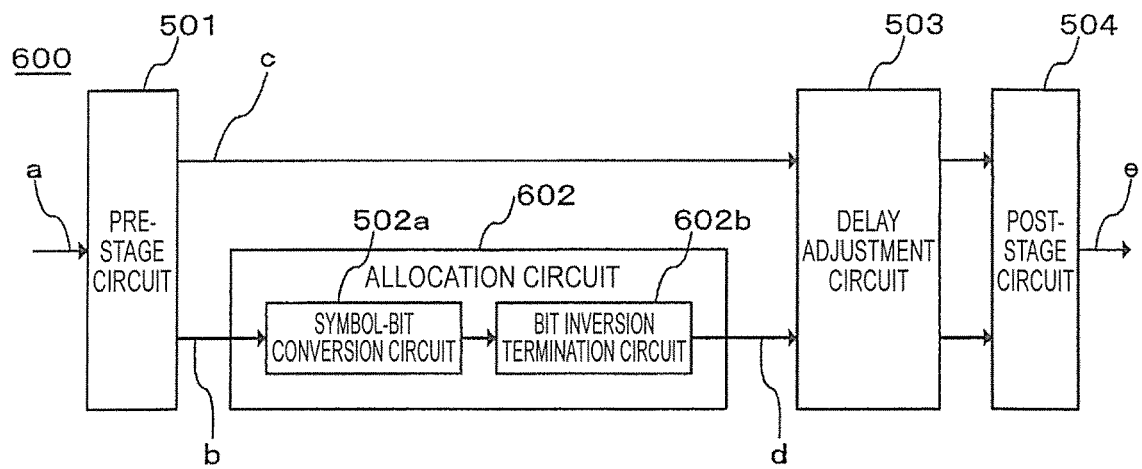
FIG. 13 is a diagram for illustrating a configuration of a distribution shaping decoder according to a thirteenth embodiment of the present invention.

FIG. 13 is a diagram for illustrating a configuration of a distribution shaping decoder 600 according to a thirteenth embodiment of the present invention. The distribution shaping decoder 600 according to the thirteenth embodiment is used in combination with the distribution shaping encoder 200 according to the ninth embodiment described above. In the following description, a component that is the same as or similar to one of the components in the twelfth embodiment is denoted by the same reference symbol, and a detailed description thereof is omitted.

The distribution shaping decoder 600 includes the pre-stage circuit 501, an allocation circuit 602, the delay adjustment circuit 503, and the post-stage circuit 504.

The allocation circuit 602 is configured to allocate, based on the method described above in the sixth embodiment, a bit sequence to the first symbol sequence "b" input from the pre-stage circuit 501, and output the bit sequence to the delay adjustment circuit 503.

To describe in detail, the allocation circuit 602 includes the symbol-bit conversion circuit 502a and a bit inversion termination circuit 602b.

The bit inversion termination circuit 602b is configured to detect an inversion control bit added to the first symbol sequence "b". The bit inversion termination circuit 602b is configured to remove the inversion control bit of the first symbol sequence "b" when the inversion control bit has the first value, namely, "0". When the inversion control bit has the second value, namely, "1", on the other hand, the bit inversion termination circuit 602b removes the inversion control bit of the first symbol sequence "b" and then inverts each bit.

The distribution shaping decoder 600 according to the thirteenth embodiment provides, when used in combination with the distribution shaping encoder 200 according to the ninth embodiment described above, effects that include a reduction in required SNR and reduced power consumption.

The bit inversion termination circuit 602b may reverse bit inversion and no bit inversion based on the method described above in the seventh embodiment.

To describe in detail, the bit inversion termination circuit 602b determines whether a condition that the inversion control bit in the bit sequence output from the symbol-bit conversion circuit 502a has the second value, namely, "1", and that the number of bits that have the second value, namely, "1", is equal to or less than a first set number in the bit sequence, or a condition that the inversion control bit in the bit sequence has the first value, namely, "0", and that the number of bits that have the second value, namely, "1", is equal to or more than a second set number in the bit sequence, is established. The first set number may be 60, for example. The second set number may be 61, for example.

When none of the conditions described above is established, the bit inversion termination circuit 602b removes the inversion control bit from the bit sequence. When one of the conditions described above is established, the bit inversion termination circuit 602b removes the inversion control bit from the bit sequence and then inverts each bit.

Fourteenth Embodiment

Figure 14:
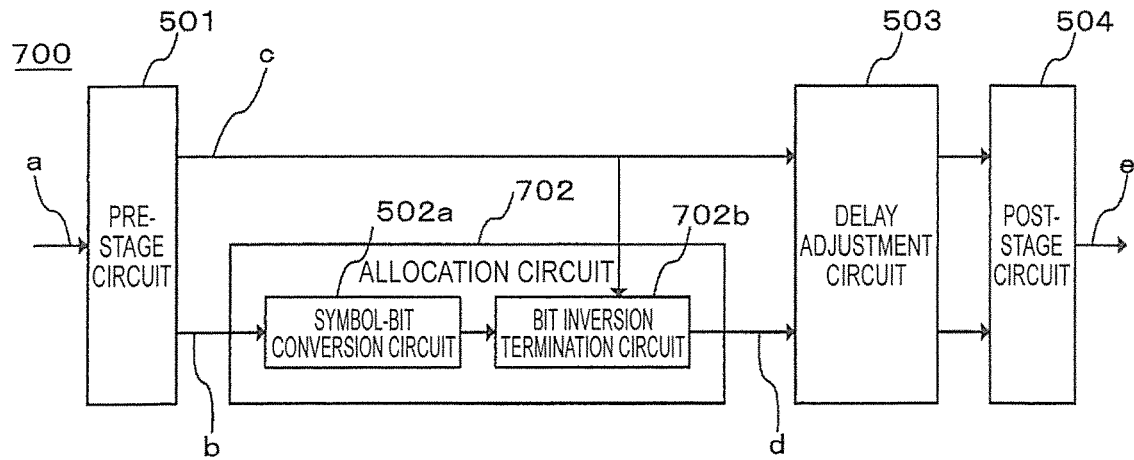
FIG. 14 is a diagram for illustrating a configuration of a distribution shaping decoder according to a fourteenth embodiment of the present invention.

FIG. 14 is a diagram for illustrating a configuration of a distribution shaping decoder 700 according to a fourteenth embodiment of the present invention. The distribution shaping decoder 700 according to the fourteenth embodiment is used in combination with the distribution shaping encoder 300 according to the tenth embodiment described above.

The distribution shaping decoder 700 includes the pre-stage circuit 501, an allocation circuit 702, the delay adjustment circuit 503, and the post-stage circuit 504.

The allocation circuit 702 is configured to allocate, based on the method described above in the sixth embodiment, a bit sequence to the first symbol sequence "b" input from the pre-stage circuit 501, and output the bit sequence to the delay adjustment circuit 503.

To describe in detail, the allocation circuit 702 includes a symbol-bit conversion circuit 502a and a bit inversion termination circuit 702b.

The bit inversion termination circuit 702b is configured to detect an inversion control bit added to the second symbol sequence "c". The bit inversion termination circuit 702b is configured to remove the inversion control bit of the second symbol sequence "c" when the inversion control bit has the first value, namely, "0". When the inversion control bit has the second value, namely, "1", on the other hand, the bit inversion termination circuit 702b removes the inversion control bit of the second symbol sequence "c" and then inverts each bit of the first symbol sequence "b".

The distribution shaping decoder 700 according to the fourteenth embodiment provides, when used in combination with the distribution shaping encoder 300 according to the tenth embodiment described above, effects that include a reduction in required SNR and reduced power consumption.

The bit inversion termination circuit 702b may reverse bit inversion and no bit inversion based on the method described above in the seventh embodiment.

To describe in detail, the bit inversion termination circuit 702b determines whether a condition that the inversion control bit included in the second symbol sequence "c" has the second value, namely, "1", and that the number of bits that have the second value, namely, "1", is equal to or less than a first set number in the bit sequence output from the symbol-bit conversion circuit 502a, or a condition that the inversion control bit included in the second symbol sequence "c" has the first value, namely, "0", and that the number of bits that have the second value, namely, "1", is equal to or more than a second set number in the bit sequence, is established. The first set number may be 60, for example. The second set number may be 61, for example.

When none of the conditions described above is established, the bit inversion termination circuit 702b removes the inversion control bit from the second symbol sequence "c". When one of the conditions described above is established, the bit inversion termination circuit 702b removes the inversion control bit from the second symbol sequence "c" and then inverts each bit of the bit sequence.

Fifteenth Embodiment

Figure 15:
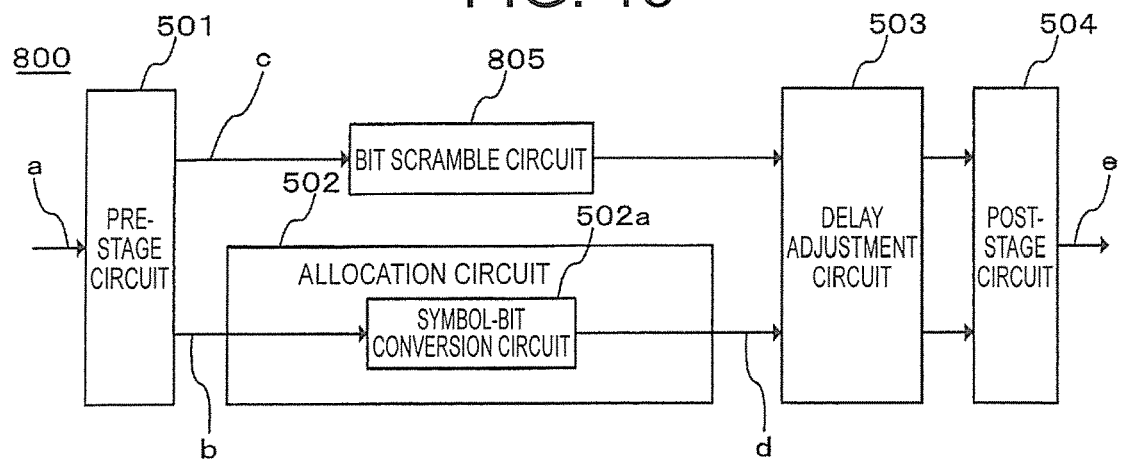
FIG. 15 is a diagram for illustrating a configuration of a distribution shaping decoder according to a fifteenth embodiment of the present invention.

FIG. 15 is a diagram for illustrating a configuration of a distribution shaping decoder 800 according to a fifteenth embodiment of the present invention. The distribution shaping decoder 800 according to the fifteenth embodiment is used in combination with the distribution shaping encoder 400 according to the eleventh embodiment described above.

The distribution shaping decoder 800 includes, in addition to the components of the distribution shaping decoder 500 according to the twelfth embodiment described above, a bit scramble circuit 805.

The bit scramble circuit 805 is configured to execute bit scrambling by calculating exclusive OR of the second symbol sequence "c" input from the pre-stage circuit 501 and a pseudo random sequence or the like, and output a result to the delay adjustment circuit 503.

In the bit scramble circuit 805, the bit scrambling executed in the eleventh embodiment described above is canceled by calculating exclusive OR with respect to a pseudo random sequence or the like.

An effect similar to the effect of the fifteenth embodiment can be obtained also in the thirteenth or fourteenth embodiment described above by adding the bit scramble circuit.

Sixteenth Embodiment

Figure 16:
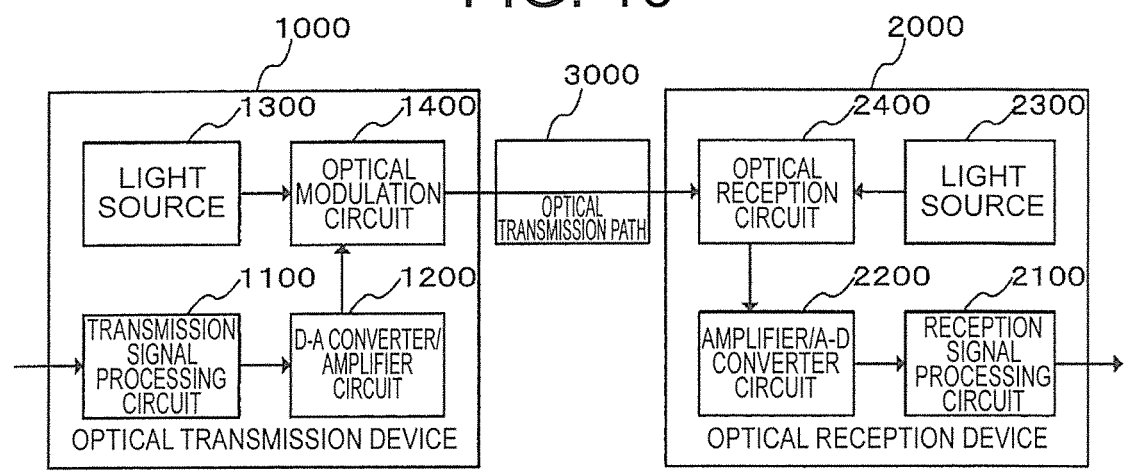
FIG. 16 is a diagram for illustrating a configuration of an optical fiber transmission system according to a sixteenth embodiment of the present invention.

FIG. 16 is a diagram for illustrating a configuration of an optical fiber transmission system according to a sixteenth embodiment of the present invention.

(Optical Fiber Transmission System)

The optical fiber transmission system includes an optical transmission device 1000, an optical reception device 2000, and an optical transmission path 3000.

(Optical Transmission Device 1000)

The optical transmission device 1000 is configured to generate an optical signal corresponding to a client signal or a frame signal that is input from the outside, and output the optical signal to the optical transmission path 3000.

To describe in detail, the optical transmission device 1000 includes a transmission signal processing circuit 1100, a D-A converter/amplifier circuit 1200, a light source 1300, and an optical modulation circuit 1400.

The transmission signal processing circuit 1100 is configured to perform signal processing on the externally input client signal or frame signal, and output a resultant digital electric signal to the D-A converter/amplifier circuit 1200.

The D-A converter/amplifier circuit 1200 is configured to perform digital-to-analog conversion and electric amplification on the digital electric signal input from the transmission signal processing circuit 1100, and output a resultant analog electric signal to the optical modulation circuit 1400.

The light source 1300 is configured to generate continuous light oscillating around a wavelength of, for example, 1,550 nm, and output the continuous light to the optical modulation circuit 1400.

The optical modulation circuit 1400 is configured to modulate the continuous light input from the light source 1300 with the analog electric signal input from the D-A converter/amplifier circuit 1200, and output an optical signal obtained by the modulation to the optical transmission path 3000.

The optical modulation circuit 1400 includes, for example, a polarization multiplexing Mach-Zehnder quadrature phase optical modulation circuit using lithium niobate.

(Optical Reception Device 2000)

The optical reception device 2000 is configured to receive the optical signal input from the optical transmission path 3000, convert the optical signal into a client signal or a frame signal, and output the client signal or the frame signal to the outside.

To describe in detail, the optical reception device 2000 includes a reception signal processing circuit 2100, an amplifier/A-D converter circuit 2200, a light source 2300, and an optical reception circuit 2400.

The light source 2300 is configured to generate continuous light oscillating around a wavelength of, for example, 1,550 nm, and output the continuous light to the optical reception circuit 2400.

The optical reception circuit 2400 is configured to perform photoelectric conversion after causing the optical signal input from the optical transmission path 3000 and the continuous light input from the light source 2300 to mix and interfere with each other, and output a resultant analog electric signal to the amplifier/A-D converter circuit 2200.

The optical reception circuit 2400 includes, for example, a polarization/phase diversity coherent receiver.

The amplifier/A-D converter circuit 2200 is configured to perform electric amplification and analog-to-digital conversion on the analog electric signal input from the optical reception circuit 2400, and output a resultant digital electric signal to the reception signal processing circuit 2100.

The reception signal processing circuit 2100 is configured to generate a client signal or a frame signal based on the digital signal input from the amplifier/A-D converter circuit 2200, and output the generated signal to the outside.

(Optical Transmission Path 3000)

The optical transmission path 3000 is configured so that the optical signal input from the optical transmission device 1000 is transmitted along the optical transmission path 3000 and is output to the optical reception device 2000.

The optical transmission path 3000 includes, for example, an optical fiber, an optical amplifier, a wavelength multiplexer/separator, an optical power monitor, a wavelength selective switch, and others.

(Internal Configuration of Transmission Signal Processing Circuit 1100)

Figure 17:
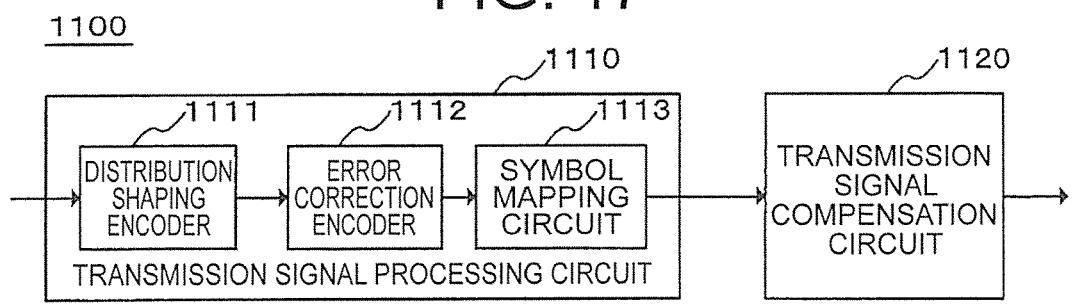
FIG. 17 is a diagram for illustrating an internal configuration of a transmission signal processing circuit included in an optical transmission device of FIG. 16.

FIG. 17 is a diagram for illustrating an internal configuration of the transmission signal processing circuit 1100 included in the optical transmission device 1000.

The transmission signal processing circuit 1100 includes a transmission signal encoding circuit 1110 and a transmission signal compensation circuit 1120.

The transmission signal encoding circuit 1110 is configured to encode the client signal or frame signal input from the outside and output the encoded signal to the transmission signal compensation circuit 1120.

To describe in detail, the transmission signal encoding circuit 1110 includes a distribution shaping encoder 1111, an error correction encoder 1112, and a symbol mapping circuit 1113.

The distribution shaping encoder 1111 is configured to perform encoding processing on the externally input client signal or frame signal and output a symbol sequence obtained by the distribution shaping encoding to the error correction encoder 1112. The distribution shaping encoder 1111 includes the distribution shaping encoder described in one of the eighth to eleventh embodiments.

The error correction encoder 1112 is configured to add an error correction parity bit to the symbol sequence input from the distribution shaping encoder 1111, and output the symbol sequence to the symbol mapping circuit 1113.

The parity bit is normally around 0.5 in mark ratio, that is, a probability at which a bit takes "1" out of the first value, namely, and the second value, namely, "1". Probabilistic shaping is accordingly not possible. The parity bit is therefore allocated to a sign bit used to control the positive/negative polarity of a modulated symbol.

In octal PAM, for example, two bits act as bits that influence the amplitude of the modulated symbol, namely, amplitude bits. The two bits are required to remain paired with each other. However, those conditions may not be satisfied depending on the combination of a parameter of distribution shaping and a parameter of error correction. In that case, bits are accommodated between the sign bit and the amplitude bits.

The symbol mapping circuit 1113 is configured to convert the bits input from the error correction encoder 1112 into a modulated symbol, and output the modulated symbol to the transmission signal compensation circuit 1120.

For example, the symbol mapping circuit 1113 groups together every 3 bits to generate a PAM symbol of octal amplitude in which amplitude values are −7, −5, −3, −1, 1, 3, 5, and 7. In the generation of the symbol, a Gray code in which only 1 bit out of the input bits differs is normally used when the amplitude values differ by one stage.

The transmission signal compensation circuit 1120 is configured to perform shaping of a signal spectrum, non-linear response compensation of the optical transmission device 1000, and the like on the encoded signal input from the transmission signal encoding circuit 1110, and output a compensated signal.

(Internal Configuration of Reception Signal Processing Circuit 2100)

Figure 18:
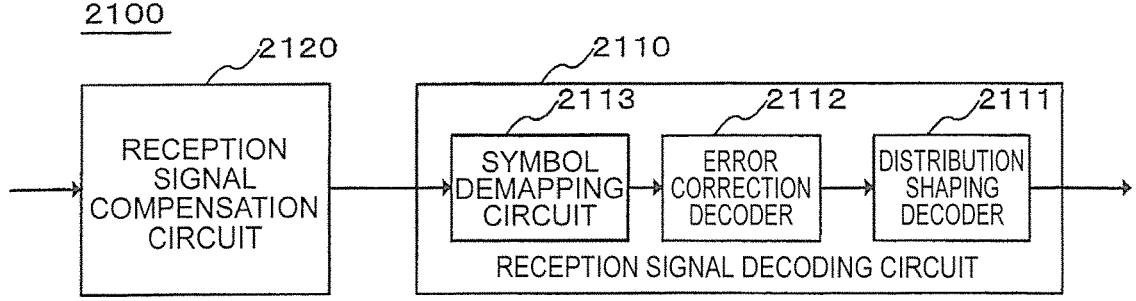
FIG. 18 is a diagram for illustrating an internal configuration of a reception signal processing circuit included in the optical transmission device of FIG. 16.

FIG. 18 is a diagram for illustrating an internal configuration of the reception signal processing circuit 2100.

The reception signal processing circuit 2100 includes a reception signal decoding circuit 2110 and a reception signal compensation circuit 2120.

The reception signal compensation circuit 2120 is configured to perform sampling phase synchronization, waveform equalization, carrier wave frequency/phase reconstruction, and the like on a reception signal input from the outside, and output a compensated signal to the reception signal decoding circuit 2110.

The reception signal decoding circuit 2110 is configured to decode the compensated signal input from the reception signal compensation circuit 2120, and output the decoded signal to the outside.

To describe in detail, the reception signal decoding circuit 2110 includes a symbol demapping circuit 2113, an error correction decoder 2112, and a distribution shaping decoder 2111.

The symbol demapping circuit 2113 is configured to perform soft decision likelihood generation or hard decision on the signal input from the reception signal compensation circuit 2120. The generation or the decision takes into account an occurrence probability, namely, prior probability, of the modulated symbol generated in the transmission signal encoding circuit 1110, and a transmission path state.

The transmission path state is normally approximated by a Gaussian noise environment. A log posterior probability ratio, namely, a posterior L-value, is expressed in a ternary or higher order format when a soft value is to be output, and is expressed in a binary format, namely, 1 bit, when hard decision is to be executed. The obtained likelihood or hard decision value is output to the error correction decoder 2112.

The error correction decoder 2112 is configured to perform error correction decoding based on the posterior L-value or hard decision value input from the symbol demapping circuit 2113, and output corrected error correction information bits to the distribution shaping decoder 2111.

The distribution shaping decoder 2111 is configured to perform decoding processing on the symbol sequence input from the error correction decoder 2112, and output the reconstructed client signal or frame signal to the outside. The distribution shaping decoder 2111 includes the distribution shaping decoder described in one of the twelfth to fifteenth embodiments.

The present invention differs from adaptive modulation. It is not required to find out where in an information source valid data is located, and it is also unrequired to switch modulation methods and other operation modes. A change in a bit sequence that is an information source causes an automatic change in the probability distribution of the output symbol sequence.

Figure 19:
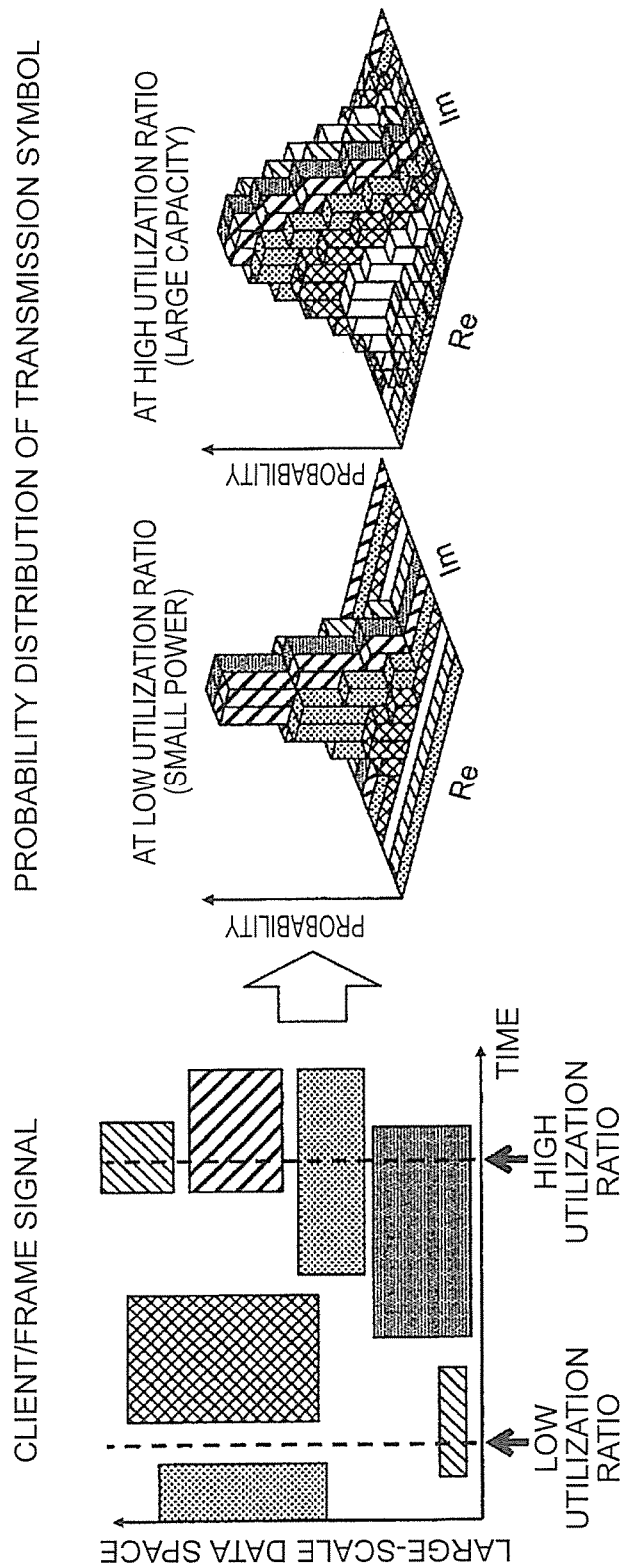
FIG. 19 is a schematic diagram of a client/frame signal which changes depending on user traffic, and of changes in a probability distribution of a transmission symbol in the optical fiber transmission system of FIG. 16.

FIG. 19 is a schematic diagram of a client/frame signal which changes depending on user traffic, and of changes in a probability distribution of a transmission symbol. At a time when user traffic is light, namely, a part of FIG. 19 in which "low utilization ratio" is displayed, the probability distribution is concentrated at the center and entropy is small. At a time when user traffic is heavy, namely, a part of FIG. 19 in which "high utilization ratio" is displayed, on the other hand, the probability distribution is spread over the entire range and entropy is large. A required SNR required to obtain predetermined performance can be reduced when entropy is small. When entropy is large, on the other hand, heavy user traffic can be accommodated.

The probability distribution of the transmission symbol changes instantly in response to a change in user traffic. In FIG. 19, the entropy of the transmission symbol is maximum in a case in which an input bit sequence input to the distribution shaping encoder 1111 has a mark ratio of 0.5 and an entropy value of 1, namely, a normally assumed case. An average symbol power output by the symbol mapping circuit 1113 peaks in this case. With approach of the mark ratio to 0 or 1 and a resultant drop in entropy, on the other hand, the entropy of the transmission symbol drops as well, and the average symbol power output by the symbol mapping circuit 1113 consequently decreases. In both of the cases, the Euclidean distance between symbols output by the symbol mapping circuit 1113 is constant, and the required SNR required for predetermined performance can therefore be reduced when the average symbol power is low.

When the average symbol power of the transmission signal changes in this manner, the amplitude may be adjusted in the transmission signal compensation circuit 1120 so that the average power is rendered constant.

When the amplitude adjustment is not to be executed in the transmission signal compensation circuit 1120, output power per operating wavelength may be rendered constant by the optical amplifier, the wavelength selective switch, and others included in the optical transmission path 3000. A time constant used to render the output power constant, however, varies depending on which device executes control for the constancy or the method of control.

Adjustment to the average symbol power may not be chosen and, instead, the entire optical transmission system may be operated with amplification gain set constant.

When there is a change in the average power of the transmission symbol, the symbol demapping circuit 2113 may cause the assumed prior probability and the transmission path state to instantly follow the change, or to stick to their respective specific conditions for the duration of operation.

As to the transmission path state, non-linearity and other factors originating not only from the optical transmission path 3000 but also from the transmission signal compensation circuit 1120, the D-A converter/amplifier circuit 1200, the light source 1300, the optical modulation circuit 1400, the light source 2300, the optical reception circuit 2400, the amplifier/A-D converter circuit 2200, and the reception signal compensation circuit 2120 are ideally taken into account, and it is desired in terms of performance to adaptively generate an expectation value of a reception symbol distribution.

On the other hand, circuit installation is simpler when the prior probability and the transmission path state are fixed to specific conditions. In an example of the case of fixing the prior probability and the transmission path state to specific conditions, the specific conditions of both of the prior probability and the transmission path state are in accordance with a transmission symbol probability distribution and noise dispersion that are observed when the input bit sequence input to the distribution shaping encoder 1111 has a mark ratio of 0.5 and an entropy value of 1.

It is easy to take in influences of other optical devices and elements as fixed factors. This enables rough maximization of performance under a maximum entropy condition which is highly likely to cause the poorest performance. Although reception is mismatched under other conditions, performance is highly likely to overcome deterioration caused by the mismatched reception and improve because of a reduction in required SNR that results from a drop in entropy.

However, when the entire optical transmission system operates under control that keeps the amplification gain constant and there is accordingly no place in which the output power is kept constant, performance improvement is limited due to a decrease in reception SNR itself that is caused by lowered entropy. Then again, deterioration caused by intersymbol interference is reduced and optical power decreases because a pattern of transition of a modulated symbol becomes unbalanced by increased transitions between small amplitudes.

Deterioration caused by fiber non-linear optical effects therefore decreases as well, and the possibility of performance improvement is consequently strong.

Output power of the optical amplifier also decreases when the entire optical fiber transmission system operates under control that keeps the amplification gain constant. Maximum output power of the optical amplifier can be kept small on the assumption that optical power having a statistically very large number of operating light wavelengths increases and decreases. For instance, when excitation light is used as in an erbium-doped optical fiber amplifier, excitation light power thereof can be rendered relatively small, and consequently contributes to a reduction in the overall power consumption of the optical transmission system.

The present invention particularly has future super large-capacity optical transmission in mind and, in view of practical utilization of integrated circuits for signal processing, is very promising with regards to power consumption reduction, in particular.

In a future scenario premised on the use of filter bank multicarrier, orthogonal frequency division multiplexing, or the like, a carrier is electrically or optically turned into multi-subcarriers, the bit rate is set to several hundred Gb/s to several ten Tb/s, and the symbol rate is set to several G symbols/s to several hundred G symbol/s.

The number of bits and the number of symbols are an example, and sequences may be longer or shorter than 200 bits and 80 symbols. In view of installation in an integrated circuit for signal processing, a desired range is from several ten bits to several hundred bits.

As a template for signal constellation, 8-QAM constellation, 16-QAM constellation, 32-QAM constellation, 64-QAM constellation, 128-QAM constellation, 256-QAM constellation, higher-order QAM constellation, amplitude phase modulation (amplitude phase shift keying: APSK), or the like is used, and processing corresponding to those templates is executed in symbol mapping and symbol demapping. Polarization multiplexing is normally employed as well.

As already stated, although examples of the case in which the first value is "0" and the second value is "1" are described above in the first to sixteenth embodiments, the present invention similarly works when the two are switched so that the first value and the second value are "1" and "0", respectively.

Figure 20:
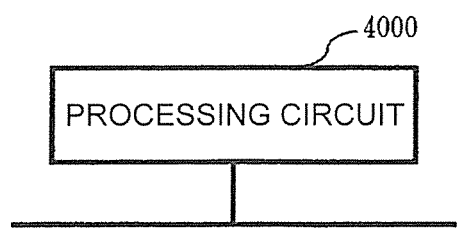
FIG. 20 is a configuration diagram for illustrating a case in which functions of the distribution shaping encoders according to the eighth embodiment to the eleventh embodiment of the present invention and the distribution shaping decoders according to the twelfth embodiment to the fifteenth embodiment are implemented by a processing circuit that is a dedicated piece of hardware.
Figure 21:
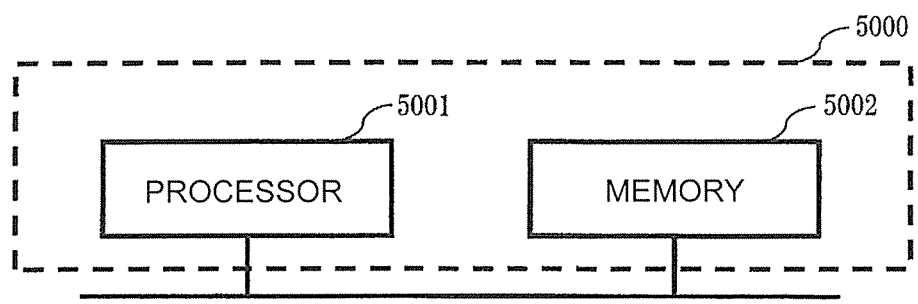
FIG. 21 is a configuration diagram for illustrating a case in which the functions of the distribution shaping encoders according to the eighth embodiment to the eleventh embodiment of the present invention and the distribution shaping decoders according to the twelfth embodiment to the fifteenth embodiment are implemented by a processing circuit that includes a processor and a memory.

The functions in the distribution shaping encoders according to the eighth to eleventh embodiments described above and the functions in the distribution shaping decoders according to the twelfth to fifteenth embodiments described above are each implemented by a processing circuit. The processing circuit implementing the functions may be a dedicated piece of hardware, or a processor that executes a program stored in a memory. FIG. 20 is a configuration diagram for illustrating a case in which the functions of the distribution shaping encoders according to the eighth to eleventh embodiments of the present invention and the distribution shaping decoders according to the twelfth to fifteenth embodiments are implemented by a processing circuit 4000 which is a dedicated piece of hardware. FIG. 21 is a configuration diagram for illustrating a case in which the functions of the distribution shaping encoders according to the eighth to eleventh embodiments of the present invention and the distribution shaping decoders according to the twelfth to fifteenth embodiments are implemented by a processing circuit 5000 which includes a processor 5001 and a memory 5002.

When the processing circuit is a dedicated piece of hardware, the processing circuit 4000 corresponds to, for example, a single circuit, a composite circuit, a programmed processor, a parallel-programmed processor, an application specific integrated circuit (ASIC), a field programmable gate array (FPGA), or a combination thereof. The functions of the respective units of the distribution shaping encoder and the distribution shaping decoder may each be implemented by an individual processing circuit 4000, or may be implemented together by one processing circuit 4000.

Meanwhile, when the processing circuit is the processor 5001, the functions of the respective units of the distribution shaping encoder and the distribution shaping decoder are implemented by software, firmware, or a combination of software and firmware. The software and the firmware are coded as programs and stored in the memory 5002. The processor 5001 reads out and executes the programs stored in the memory 5002, to thereby implement the function of each of the units. That is, the distribution shaping encoders and the distribution shaping decoders each include the memory 5002 for storing programs that are executed by the processing circuit 5000 to ultimately execute the control operations described above.

It is also understood that those programs cause a computer to execute procedures and methods for the respective units. In this case, the memory 5002 corresponds to, for example, a random access memory (RAM), a read only memory (ROM), a flash memory, an erasable programmable read only memory (EPROM), an electrically erasable and programmable read only memory (EEPROM), or other such non-volatile or volatile semiconductor memory. The memory 2002 also corresponds to, for example, a magnetic disk, a flexible disk, an optical disc, a compact disc, a MiniDisk, or a DVD.

Some of the functions of the respective units described above may be implemented by a dedicated piece of hardware, and other thereof may be implemented by software or firmware.

In this manner, the processing circuit can implement the function of each of the units described above by hardware, software, firmware, or a combination thereof.

REFERENCE SIGNS LIST 100, 200, 300, 400 distribution shaping encoder, 101 pre-stage circuit, 102, 202, 302 allocation circuit, 103 delay adjustment circuit, 104 post-stage circuit, 405 bit scramble circuit, 500, 600, 700, 800 distribution shaping decoder, 501 pre-stage circuit, 502, 602, 702 allocation circuit, 503 delay adjustment circuit, 504 post-stage circuit, 805 bit scramble circuit, 1000 optical transmission device (transmission device), 2000 optical reception device (reception device), 3000 optical transmission path (transmission path)

The invention claimed is:

1. A distribution shaping method, comprising allocating a symbol sequence of a predetermined length to a bit sequence of a predetermined length, by allocating a symbol sequence smaller in average power out of available symbol sequences when the bit sequence includes a larger number of bits that have a first value.

2. The distribution shaping method according to claim 1, further comprising allocating a symbol sequence selected in advance to the bit sequence when every bit in the bit sequence has a second value.

3. The distribution shaping method according to claim 2, wherein the symbol sequence selected in advance is a symbol sequence smallest in average power among the available symbol sequences.

4. The distribution shaping method according to claim 1, further comprising:
   adding, when the number of bits that have a second value is larger than the number of bits that have the first value in the bit sequence, the first value as an inversion control bit to the bit sequence; and
   adding, when the number of bits that have the second value is equal to or smaller than the number of bits that have the first value in the bit sequence, the second value as an inversion control bit after inverting each bit in the bit sequence.

5. A distribution deshaping method, comprising allocating a bit sequence of a predetermined length to a symbol sequence of a predetermined length, by allocating a bit sequence larger in the number of bits that have a first value out of available bit sequences when the symbol sequence is smaller in average power.

6. The distribution deshaping method according to claim 5, further comprising allocating a bit sequence in which every bit has a second value to the symbol sequence when the symbol sequence is a symbol sequence selected in advance, wherein the symbol sequence selected in advance is a symbol sequence smallest in average power among the available symbol sequences.

7. The distribution deshaping method according to claim 5, further comprising:
   removing, when the bit sequence includes an inversion control bit that has the first value, the inversion control bit of the bit sequence; and
   inverting, when the bit sequence includes an inversion control bit that has a second value, each bit after removing the inversion control bit of the bit sequence.

8. The distribution deshaping method according to claim 5, further comprising:
   determining, for the bit sequence, whether a condition that an inversion control bit has a second value and that the number of bits that have the second value is equal to or less than a first set number, or a condition that the inversion control bit has the first value and that the number of bits that have the second value is equal to or more than a second set number, is established;
   removing the inversion control bit of the bit sequence when the condition is not established; and
   removing the inversion control bit of the bit sequence and then inverting each bit when the condition is established.

9. A distribution shaping encoder, comprising:
   a pre-stage circuit configured to divide, following a predetermined rule; a bit sequence of a predetermined length into a first bit sequence and a second bit sequence, and output the first bit sequence and the second bit sequence;
   an allocation circuit configured to allocate, to the first bit sequence, a symbol sequence smaller in average power out of available symbol sequences when the first bit sequence includes a larger number of bits that have a first value;
   a delay adjustment circuit configured to adjust a delay of the second bit sequence and a delay of the symbol sequence so that the delays are the same, and output the second bit sequence and the symbol sequence; and
   a post-stage circuit configured to generate a new symbol sequence by combining, following a predetermined rule, the second bit sequence and the symbol sequence that are output from the delay adjustment circuit, and output the new symbol sequence.

10. The distribution shaping encoder according to claim 9, wherein the allocation circuit is configured to:
   allocate a symbol sequence selected in advance to the first bit sequence when every bit in the first bit sequence has a second value;
   add, when the number of bits that have a second value is larger than the number of bits that have the first value in the first bit sequence, the first value as an inversion control bit to the first bit sequence; and
   add, when the number of bits that have the second value is equal to or smaller than the number of bits that have the first value in the first bit sequence, the second value as an inversion control bit after inverting each bit in the first bit sequence.

11. The distribution shaping encoder according to claim 9, wherein the allocation circuit is configured to:
   allocate a symbol sequence selected in advance to the first bit sequence when every bit in the first bit sequence has a second value;
   add, when the number of bits that have a second value is larger than the number of bits that have the first value in the first bit sequence, the first value as an inversion control bit to the second bit sequence; and
   add, when the number of bits that have the second value is equal to or smaller than the number of bits that have the first value in the first bit sequence, the second value as an inversion control bit to the second bit sequence after inverting each bit in the first bit sequence.

12. The distribution shaping encoder according to claim 9, further comprising a bit scramble circuit configured to calculate exclusive OR of the second bit sequence and a predetermined sequence.

13. A distribution shaping decoder, comprising:
   a pre-stage circuit configured to divide, following a predetermined rule, a symbol sequence of a predetermined length into a first symbol sequence and a second symbol sequence, and output the first symbol sequence and the second symbol sequence;
   an allocation circuit configured to allocate, to the first symbol sequence, a bit sequence larger in the number of bits that have a first value out of available bit sequences when the first symbol sequence is smaller in average power;
   a delay adjustment circuit configured to adjust a delay of the second symbol sequence and a delay of the bit sequence so that the delays are the same, and output the second symbol sequence and the bit sequence; and a post-stage circuit configured to generate a new bit sequence by combining, following a predetermined rule, the second symbol sequence and the bit sequence that are output from the delay adjustment circuit, and output the new bit sequence.

14. The distribution shaping decoder according to claim 13, wherein the allocation circuit is configured to:
allocate a bit sequence in which every bit has a second value to the first symbol sequence when the first symbol sequence is a symbol sequence selected in advance;
remove, when the bit sequence includes an inversion control bit that has the first value, the inversion control bit of the bit sequence;
invert, when the bit sequence includes an inversion control bit that has a second value, each bit after removing the inversion control bit of the bit sequence;
determine whether a condition that an inversion control bit in the bit sequence has a second value and that the number of bits of the bit sequence that have the second value is equal to or less than a first set number, or a condition that the inversion control bit in the bit sequence has the first value and that the number of bits of the bit sequence that have the second value is equal to or more than a second set number, is established;
remove the inversion control bit from the bit sequence when the condition is not established;
remove the inversion control hit from the hit sequence and then invert each bit when the condition is established;
remove, when the second symbol sequence includes an inversion control bit that has the first value, the inversion control bit included in the second symbol sequence;
invert, when the second symbol sequence includes an inversion control bit that has a second value, each bit in the bit sequence after removing the inversion control bit included the second symbol sequence;
determine whether a condition that an inversion control bit included in the second symbol sequence has a second value and that the number of bits of the bit sequence that have the second value is equal to or less than a first set number, or a condition that the inversion control bit included in the second symbol sequence has the first value and that the number of bits of the bit sequence that have the second value is equal to or more than a second set number, is established;
remove the inversion control bit from the second symbol sequence when the condition is not established; and
remove the inversion control bit from the second symbol sequence and then invert each bit in the bit sequence when the condition is established.

15. The distribution shaping decoder according to claim 13, further comprising a bit scramble circuit configured to calculate exclusive OR of the second symbol sequence and a predetermined sequence.

16. A transmission system, comprising:
a transmission device including the distribution shaping encoder of claim 9;
a reception device including the distribution shaping decoder of claim 13; and
a transmission path.

17. The transmission system according to claim 16,
wherein the distribution shaping decoder further includes an error correction decoder,
wherein, in the error correction decoder, decoding is repeated a variable number of times,
wherein the distribution shaping encoder further includes a symbol mapping circuit,
wherein, in the symbol mapping circuit, a transmission symbol probability distribution is assumed so as to correspond to a condition that an occurrence probability of the first value and an occurrence probability of the second value are each 0.5 in a bit sequence equivalent to a client signal or a frame signal that includes user traffic,
wherein the transmission device further includes a transmission signal compensation circuit, and
wherein, in one of the transmission signal compensation circuit or the transmission path or both of the transmission signal compensation circuit and the transmission path, average symbol power is controlled so as to be constant at any time constant.

18. The transmission system according to claim 16,
wherein the distribution shaping decoder further includes an error correction decoder,
wherein, in the error correction decoder, decoding is repeated a variable number of times,
wherein the distribution shaping encoder further includes a symbol mapping circuit,
wherein, in the symbol mapping circuit, a transmission symbol probability distribution is assumed so as to correspond to a condition that an occurrence probability of the first value and an occurrence probability of the second value are each 0.5 in a bit sequence equivalent to a client signal or a frame signal that includes user traffic,
wherein the transmission device further includes a transmission signal compensation circuit, and
wherein the transmission signal compensation circuit and the transmission path are each configured to operate under control that keeps gain constant.

* * * * *